United States Patent
Daikoku

(10) Patent No.: US 11,662,512 B2
(45) Date of Patent: May 30, 2023

(54) LIGHT-EMITTING MODULE

(71) Applicant: NICHIA CORPORATION, Anan (JP)

(72) Inventor: Shinichi Daikoku, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 17/412,914

(22) Filed: Aug. 26, 2021

(65) Prior Publication Data
US 2022/0066083 A1    Mar. 3, 2022

(30) Foreign Application Priority Data

Aug. 31, 2020  (JP) ............... JP2020-145558

(51) Int. Cl.
| | | |
|---|---|---|
| *F21V 8/00* | (2006.01) | |
| *H01L 33/50* | (2010.01) | |
| *H01L 33/60* | (2010.01) | |

(52) U.S. Cl.
CPC ......... *G02B 6/0026* (2013.01); *G02B 6/0021* (2013.01); *H01L 33/50* (2013.01); *H01L 33/60* (2013.01); *G02B 6/0068* (2013.01)

(58) Field of Classification Search
CPC .. G02B 6/0026; G02B 6/0021; G02B 6/0068; H01L 33/50; H01L 33/60
See application file for complete search history.

(56) References Cited

U.S. PATENT DOCUMENTS

| | | |
|---|---|---|
| 2014/0048824 A1 | 2/2014 | Hsieh |
| 2018/0239193 A1 | 8/2018 | Hayashi |
| 2019/0049649 A1 | 2/2019 | Hayashi et al. |
| 2020/0043903 A1* | 2/2020 | Kasai ................ H01L 33/44 |
| 2020/0105973 A1 | 4/2020 | Kasai et al. |
| 2022/0037567 A1 | 2/2022 | Kameshima et al. |

FOREIGN PATENT DOCUMENTS

| | | |
|---|---|---|
| JP | 2010-164976 A | 7/2010 |
| JP | 2015-525001 A | 8/2015 |
| JP | 2018-133304 A | 8/2018 |
| JP | 2019-012681 A | 1/2019 |
| JP | 2019-175846 A | 10/2019 |

(Continued)

*Primary Examiner* — Mary Ellen Bowman
(74) *Attorney, Agent, or Firm* — Global IP Counselors, LLP

(57) ABSTRACT

A light-emitting module includes: a light-guiding plate having a first main surface serving as a light extracting surface and a second main surface opposite to the first main surface, a recess defined in the second main surface by at least one lateral surface and a base surface; a wavelength conversion member in the recess of the light-guiding plate, the wavelength conversion member having a first surface facing the base surface defining the recess, a second surface opposite to the first surface, and at least one lateral surface between the first surface and the second surface; at least one light-emitting element bonded to the second surface of the wavelength conversion member; a light-transmissive member disposed between the lateral surface defining the recess and the lateral surface of the wavelength conversion member; and a light-reflective member covering the second main surface of the light-guiding plate and lateral surfaces of the light-emitting element.

9 Claims, 5 Drawing Sheets

(56) References Cited

FOREIGN PATENT DOCUMENTS

| | | |
|---|---|---|
| JP | 2020-021688 A | 2/2020 |
| JP | 2020-021910 A | 2/2020 |
| JP | 2020-057748 A | 4/2020 |
| JP | 2020-096151 A | 6/2020 |
| WO | 2020067495 A1 | 4/2020 |

* cited by examiner

LIGHT-EMITTING MODULE

CROSS-REFERENCE TO RELATED APPLICATION

This application claims priority to Japanese Patent Application No. 2020-145558 filed on Aug. 31, 2020, the entire contents of which are hereby incorporated herein by reference.

BACKGROUND OF THE INVENTION

1. Field of the Invention

The present disclosure relates to a light-emitting module.

2. Description of Related Art

A light-emitting module including a light-emitting element and a light-guiding plate is widely used as a light source for a backlight of a liquid-crystal display, a display, and the like (for example, see Japanese Unexamined Patent Application Publication No. 2010-164976 and WO20141026468).

SUMMARY

An object of the present disclosure is to provide a light-emitting module that exhibits a reduced color shift.

According to one aspect of the present disclosure, a light-emitting module includes: a light-guiding plate having a first main surface serving as a light extracting surface and a second min surface located opposite to the first main surface, a recess being defined in the second main surface by at least one lateral surface and a base surface; a wavelength conversion member disposed in the recess of the light-guiding plate, the wavelength conversion member having a first surface facing the base surface defining the recess, a second surface opposite to the first surface, and at least one lateral surface between the first surface and the second surface; at least one light-emitting element bonded to the second surface of the wavelength conversion member; a light-transmissive member disposed between the at least one lateral surface defining the recess and the at least one lateral surface of the wavelength conversion member; and a light-reflective member covering the second main surface of the light-guiding plate and lateral surfaces of the at least one light-emitting element.

The present disclosure can provide a light-emitting module that exhibits a reduced color shift.

DETAILED DESCRIPTION OF EMBODIMENTS

Figure 1:
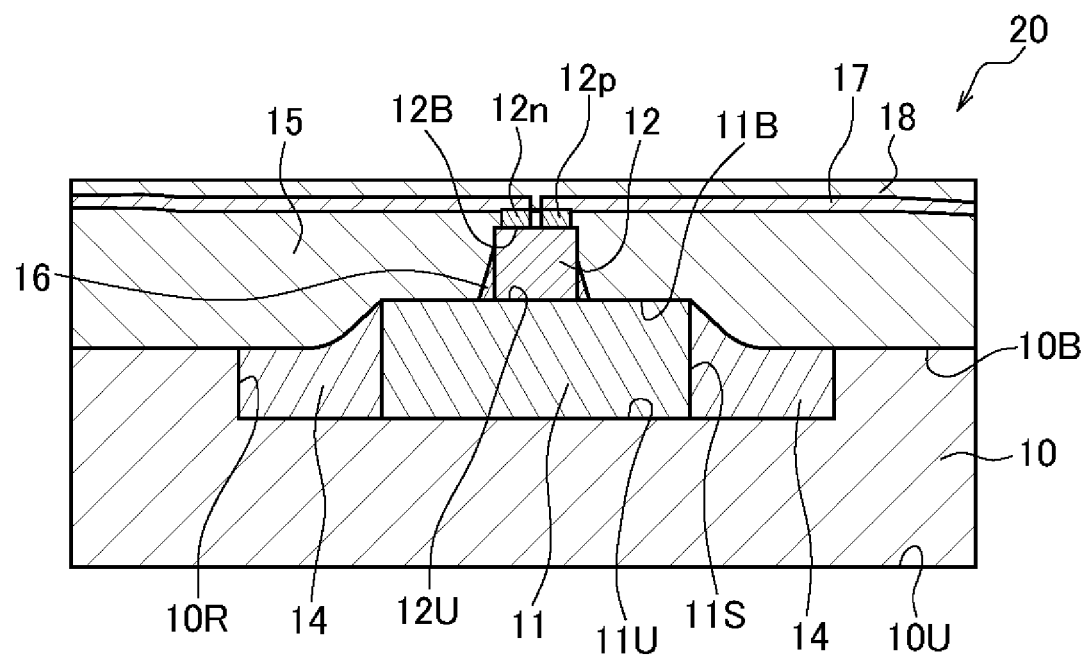
FIG. 1 is a schematic cross-sectional view of a light-emitting module of an embodiment of the present invention.

Certain embodiments of the present invention will be described below in detail on the basis of the accompanying drawings. In the description below, terms indicating specific directions or positions (such as "up," "down," and other terms containing these terms) will be used when appropriate. These terms are used to facilitate understanding of the present invention referring to the drawings, and the meanings of these terms do not limit the technical scope of the present invention. For example, a surface of each member located on the light-exiting surface side of the light-emitting module may be referred to as a first main surface, a first surface, or an upper surface, and a surface opposite to the light-exiting surface may be referred to as a second main surface, a second surface, or a lower surface. A portion with the same reference numeral in a plurality of drawings represents the same or equivalent portion or member.

In the embodiments described below, examples of light-emitting modules are described to a give concrete form to the technical idea of the present invention, and the present invention is not limited to the description below. Unless otherwise specified, sizes, materials, shapes, and relative positions of constituent components described below are not intended to limit the scope of the present invention thereto, but rather are described as examples. Constitutions described in one embodiment may be applicable to other embodiments. Sizes or positional relationships of components illustrated in the drawings may be exaggerated in order to clarify the descriptions.

Light-Emitting Module

FIG. 1 schematically shows a light-emitting module according to an embodiment in the present application.

A light-emitting module 20 includes a light-guiding plate 10 having a first main surface 10U serving as a light extracting surface and a second main surface 10B located opposite to the first main surface 10U, a recess 10R being defined in the second main surface 10B by at least one lateral surface and a base surface; a wavelength conversion member 11 disposed in the recess 10R of the light-guiding plate 10, the wavelength conversion member 11 having a first surface 11U facing the base surface defining the recess 10R, a second surface 11B located opposite to the first surface 11U, and at least one lateral surface 11S between the first surface 11U and the second surface 11B; a light-emitting element 12 bonded to the second surface 11B of the wavelength conversion member 11; a light-transmissive member 14 disposed on the base surface of the recess between the at least one lateral surface defining the recess 10R and the at least one lateral surface of the wavelength conversion member 11; and a light-reflective member 15 covering the second main surface 10B of the light-guiding plate 10 and lateral surfaces of the light-emitting element 12.

With such a structure, color shift of the light-emitting module can be reduced.

The light-emitting module as described above can be obtained, for example, through the steps below.

A method of manufacturing a light-emitting module includes providing the light-guiding plate 10 having the first main surface 10U serving as the light extracting surface and the second main surface 10B located opposite to the first main surface 10U, a recess 10R being defined in the second main surface 10B by at least one lateral surface and a base surface; disposing the wavelength conversion member 11 in the recess 10R of the light-guiding plate 10, the wavelength conversion member 11 having the first surface 11U facing the base surface defining the recess 10R, the second surface 11B opposite to the first surface 11U, and the at least one lateral surface 11S between the first surface 11U and the second surface 11B; bonding the light-emitting element 12 to the second surface 11B of the wavelength conversion member 11; disposing the light-transmissive member 14 on the base surface of the recess between the at least one lateral surface defining the recess 10R and the at least one lateral surface of the wavelength conversion member 11, and covering the second main surface 10B of the light-guiding plate 10 and the lateral surfaces of the light-emitting element 12 with the light-reflective member 15. The light-emitting module that has a small color shift can be manufactured in the method of manufacturing as described above.

Each member will be described below in detail.

Light-Guiding Plate 10

The light-guiding plate 10 is a light-transmissive member on which light emitted from the light-emitting element is incident, and performs surface emission of light. As shown in FIG. 1, the light-guiding plate 10 has the first main surface 10B and the second main surface 10B opposite to the first main surface 10B. The first main surface 10U serves as the light extracting surface.

In the second main surface 10B, the recess 10R is defined. A single light-guiding plate can define at least one recess 10R. The recess 10R is defined by at least one lateral surface and a base surface. For example, in a plan view, the recess 10R can have a size with an opening width of 0.05 mm to 10 mm. For example, the recess 10R can have a depth of 0.05 mm to 4 mm. Examples of the planar shape of the recess 10R include polygonal shapes such as quadrilateral shapes and pentagonal shapes, circular shapes, and elliptic shapes. Among these shapes, a quadrilateral shape or a circular shape is preferable. The lateral surface defining the recess 10R can be a surface perpendicular to the first main surface 10U or the second main surface 10B, an inclined surface slanted with respect to the second main surface 10B, or a curved surface. The base surface defining the recess 10R is preferably a surface parallel to the first main surface 10U or the second main surface 10B.

In the case in which a plurality of recesses 10R are defined in the light-guiding plate 10, the recesses 10R are preferably arranged at regular intervals in a row direction and/or a column direction. Alternatively, the recesses 10R, can be arranged at irregular intervals in the row direction and/or the column direction. For example, the recesses 10R may be arranged such that the intervals increase from the center toward the periphery of the light-guiding plate 10.

An arrangement pitch (distance between two closest recesses) of the recesses 10R in the light-guiding plate 10 can be adjusted as appropriate in consideration of the size of the recesses 10R, the size and properties of the light-emitting elements to be used, luminance on the light-guiding plate to be obtained, and the like. For example, the arrangement pitch of the recesses 10R is in a range of 5 to 20 times the length of a side of the light-emitting elements. Specifically, the arrangement pitch can be 0.05 mm to 20 mm.

For example, the planar shape of the light-guiding plate 10 can be a polygonal shape or a circular shape. For example, the light-guiding plate 10 can have a size with a side of a length in a range of 1 cm to 200 cm.

For the light-guiding plate 10, a resin material such as thermoplastic resins including acrylic resins, polycarbonates, cyclic polyolefins, polyethylene terephthalate), and polyesters and thermosetting resins including epoxy resins and silicone resins or a light-transmissive material such as glass can be used. A thermoplastic resin material is particularly preferable in view of efficient manufacture by injection molding. Among these materials, polycarbonates and poly (ethylene terephthalate), which are highly transparent and inexpensive, are preferable.

The light-guiding plate 10 can be provided by purchasing or forming. Examples of the method used for forming the light-guiding plate 10 include injection molding and transfer molding. The recess 10R, of the light-guiding plate 10 is preferably formed at the same time as formation of the light-guiding plate 10. This can reduce misalignment of the recess 10R. The light-guiding plate 10 can also be provided by forming or purchasing a light-transmissive plate having no recess and then forming the recess in the light-transmissive plate.

The light-guiding plate 10 may be composed of a single layer or may have a layered structure made of a plurality of light-transmissive layers. In the case in which a plurality of light-transmissive layers are layered, the entirety of layered surfaces of the light-transmissive layers can be bonded together with an adhesive or adhesive sheets. Alternatively, a layer with a different refractive index, such as an air layer, may be disposed between the light-transmissive layers. This facilitates diffusion of light, so that the light-emitting module with reduced variations in luminance can be obtained.

Figure 5A:
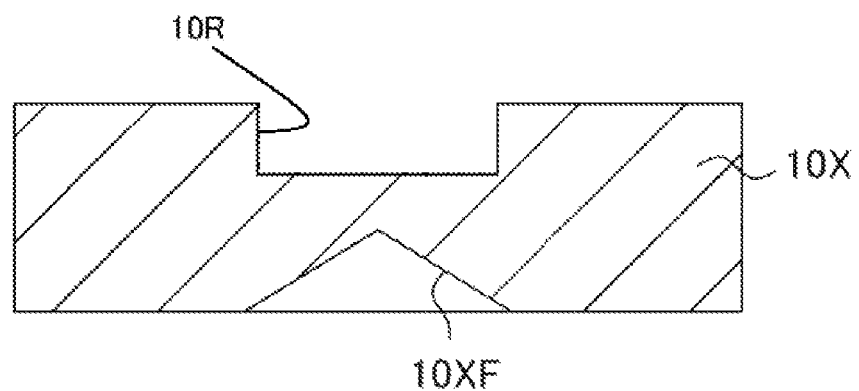
FIG. 5A is a schematic cross-sectional view of another embodiment of a light-guiding plate used in the light-emitting module according to one embodiment of the present invention.
Figure 5B:
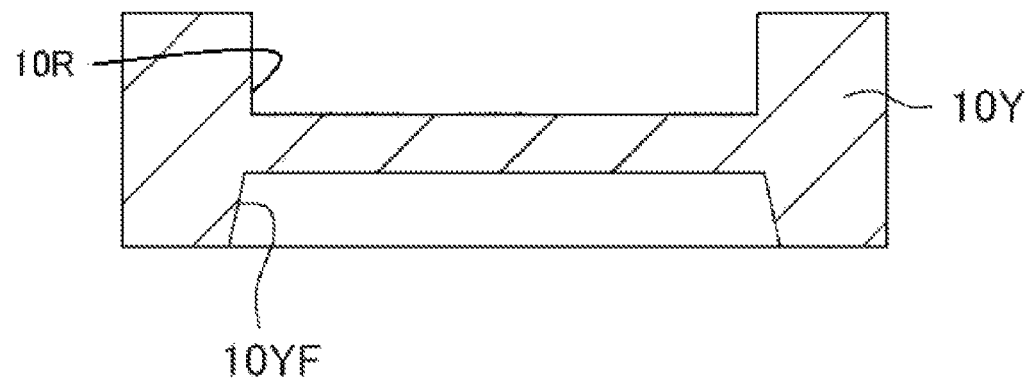
FIG. 5B is a schematic cross-sectional view of still another embodiment of the light-guiding plate used in the light-emitting module according to one embodiment of the present invention.

The light-guiding plate 10 may have an optical functional portion that has the function of reflecting or diffusing light at the first main surface 10U side. The optical functional portion preferably has the function of spreading light in a plane of the light-guiding plate 10 to have uniform emission intensity in the plane of the light-guiding plate 10. For example, the optical functional portion can be a depression on the first main surface 10U side. As shown in FIGS. 5A and 5B, in light-guiding plates 10X and 10Y, depressions 10XF and 10YF can have a conical or pyramidal shape (FIG. 5A) or a frustum shape (FIG. 5B). For example, a conical shape, a pyramidal shape such as quadrangular or hexagonal pyramidal shapes, conical frustum shapes, or a pyramidal frustum shape such as quadrangular or hexagonal pyramidal frustum shapes can be employed. A lateral surface of the depression can be linear or curved in a cross-sectional view. The lateral surface of the depression can be a curved surface convex inward or concave inward in a cross-sectional view. The lateral surface of the depression can be an inclined surface, a surface without steps, or a stepped surface. Alternatively, the lateral surface of the depression can be a surface with a constant curvature or a surface including two or more curved surfaces with different curvatures in a cross-sectional view.

In the case in which a material (such as air) with a refractive index different from the refractive index of the light-guiding plate 10 is disposed in these depressions, light emitted from the light-emitting element incident on the interface with the lateral surface of each depression can be reflected in a lateral direction. A light-reflective material (such as a light-reflective metal, a white resin, and a dielectric film) or the like may be disposed in the depression.

The optical functional portion is preferably located at a position overlapping with the recess 10R in a plan view. The center of the optical functional portion preferably corresponds to the center of the recess 10R in a plan view.

The first main surface 10U and/or second main surface 10B of the light-guiding plate 10 may have unevenness.

Wavelength Conversion Member 11

The wavelength conversion member 11 is a member adapted to convert the wavelength of light emitted from the light-emitting element and is disposed in the recess 10R of the light-guiding plate 10. The wavelength conversion member has the first surface 11U facing the base surface defining the recess 10R, the second surface 11B opposite to the first surface 11U, and the at least one lateral surface 11S between the first surface 11U and the second surface 11B.

For example, the wavelength conversion member 11 contains a phosphor and a light-transmissive base material. For the light-transmissive base material, an epoxy resin, a silicone resin, a mixture of these resins, glass, or the like can be used. A silicone resin is preferable in view of light resistance and ease of formation of the wavelength conversion member 11. The light-transmissive base material constituting the wavelength conversion member 11 is preferably a material having a refractive index higher than that of a material of the light-guiding plate 10.

Examples of the phosphor contained in the wavelength conversion member 11 include yttrium-aluminum-garnet based phosphors (such as $Y_3(Al,Ga)_5O_{12}$:Ce), lutetium-aluminum-garnet based phosphors (such as $Lu_3(Al,Ga)_5O_{12}$:Ce), terbium-aluminum-garnet based phosphors (such as $Tb_3(Al,Ga)_5O_{12}$:Ce), silicate based phosphors (such as $(Ba,Sr)_2SiO_4$:Eu), and chlorosilicate based phosphors (such as $Ca_8Mg(SiO_4)_4C_{12}$:Eu). Further, the examples of the phosphor include nitride based phosphors such as β-SiAlON based phosphors (such as $Si_{6-z}Al_zO_zN_{8-z}$:Eu (0<z<4.2)), α-SiAlON based phosphors (such as $M_z(Si,Al)_{12}(O,N)_{16}$ (where 0<z≤2, M is Li, Mg, Ca, Y, or a lanthanoid element except for La and Ce), and nitrogen-containing calcium aluminosilicate (CASN or SCASN) based phosphors (such as (Sr,Ca)AlSiN$_3$:Eu). The examples of the phosphor also include a phosphor represented by General Formula (I) $Ma_xMb_yAl_3N_z$:Eu (in General Formula (I) above, Ma is at least one element selected from the group consisting of Ca, Sr, and Ba, Mb is at least one element selected from the group consisting of Li, Na, and K, and x, y, and z respectively satisfy 0.5≤x≤1.5, 0.5≤y≤1.2, and 3.5≤z≤4.5). The examples of the phosphor also include SGS based phosphors (such as $SrGa_2S_4$:Eu). The examples of the phosphor also include manganese-activated fluoride based phosphors (phosphor represented by General Formula (II) $A_2[M_{1-a}Mn_aF_6]$ (in General Formula (II) above, A is at least one selected from the group consisting of K, Li, Na, Rb, Cs, and NH$_4$, M is at least one element selected from the group consisting of the Group IV elements and the Group XIV elements, and a satisfies 0<a<0.2)). Typical examples of the manganese-activated fluoride phosphors include manganese-activated potassium fluorosilicate phosphors (such as KSF ($K_2SiF_6$:Mn)). In particular, by using a plurality of types of wavelength conversion members in a single wavelength conversion member 11, more preferably by incorporating a β-SiAlON based phosphor adapted to emit green light and a fluoride phosphor such as a KSF phosphor that emits red light in the wavelength conversion member 11, the color reproduction range of the light-emitting module can be expanded.

The phosphor and/or the light-transmissive material constituting the wavelength conversion member 11 can be appropriately selected, and the amounts thereof can be adjusted according to the target chromaticity. The phosphor may be substantially evenly or unevenly distributed in the light-transmissive material. The wavelength conversion member may have a layered structure made of a plurality of layers containing the same or different concentrations of the same or different phosphors.

In the wavelength conversion member 11, a layer containing a phosphor or a layer different from the layer containing a phosphor may contain a diffusing material. Examples of the diffusing material include $SiO_2$ and $TiO_2$.

In the case in which the light-guiding plate 10 defines a plurality of recesses 10R, the wavelength conversion member 11 is preferably disposed in each recess 10R. The planar shape of the wavelength conversion member 11 can be a polygonal shape or a circular shape. Among these shapes, a quadrilateral shape is preferable. The wavelength conversion member 11 preferably has such a size that, for example, the whole outer periphery of the wavelength conversion member 11 is located inward of the outer periphery of the recess 10R of the light-guiding plate 10. In particular, the area of the wavelength conversion member 11 in a plan view is preferably in a range of 99% to 60% of the area of the recess 10R of the light-guiding plate 10 in a plan view. As will be described below, an area larger than the light extracting surface of the light-emitting element is preferable.

Figure 2:
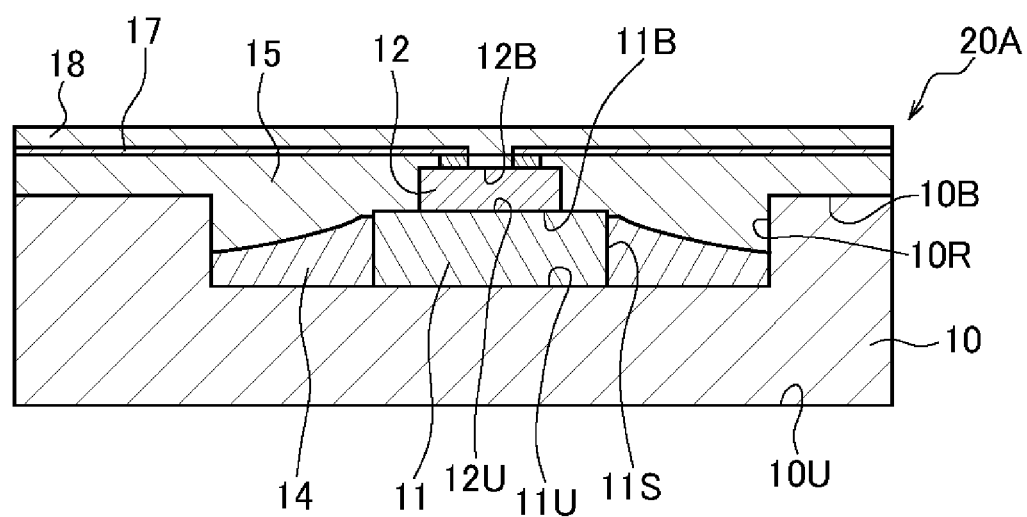
FIG. 2 is a schematic cross-sectional view of a light-emitting module of another embodiment of the present invention.

The wavelength conversion member 11 can have such a cross-sectional shape that the wavelength conversion member 11 is located inward of the recess 10R of the light-guiding plate 10. For example, the cross-sectional shape of the wavelength conversion member 11 may be any of a trapezoidal or semicircular shape with a narrow or wide upper surface, or the like. In particular, the wavelength conversion member 11 preferably has a quadrilateral cross-sectional shape. The wavelength conversion member can have a thickness equal to or larger than a depth of the recess 10R as shown in FIG. 1. This structure allows the light-reflective member to easily reflect a portion of light emitted laterally from the wavelength conversion member 11, so that light-emitting module can more greatly diffuse light. Alternatively, the wavelength conversion member 11 can have a thickness smaller than the depth of the recess 10R as shown in FIG. 2. This structure allows for reducing a thickness of the light-emitting module 20A.

A surface of the wavelength conversion member 11 may be uneven.

The wavelength conversion member 11 as described above can be provided by purchasing a member that has been formed into a predetermined size and shape. Alternatively, a sheet-shaped wavelength conversion member is provided by purchasing or forming, and is cut to be singulated into a predetermined size, so that wavelength conversion members in the form of small pieces can be provided. Examples of the method used for forming the wavelength conversion member include formation into a sheet or a small piece by injection molding or transfer molding, and shaping into a sheet or a block using a coating technique, in which printing or the like is performed on a base. The sheet-shaped wavelength conversion member can be formed into wavelength conversion members in the form of small pieces by using a dicing saw or an ultrasonic cutter or by punching or the like. The wavelength conversion member in the form of a small piece can be sucked with a collet or the like and disposed in the recess of the light-guiding plate.

Light-Transmissive Member 14

The light-transmissive member 14 is disposed between the at least one lateral surface defining the recess 10R and the at least one lateral surface 11S of the wavelength conversion member 11 in order to secure the wavelength conversion member 11 in the recess 10R of the light-guiding plate 10. The light-transmissive member 14 can be disposed only inside the recess 10R of the light-guiding plate 10. Alternatively, a portion of the light-transmissive member 14 may be located outside the recess 10R, with another portion of the light-transmissive member 14 located inside the recess 10R of the light-guiding plate 10. The upper surface of the light-transmissive member 14 may have a constant height in the recess 10R. Alternatively, the height of the light-transmissive member 14 may vary in the recess 10R. For example, in the recess 10R, the height of the wavelength conversion member 11 may gradually increase or decrease from the lateral surface 11S of the wavelength conversion member 11 toward the at least one lateral surface defining the recess 10R. The light-transmissive member 14 preferably covers the entire lateral surface 11S of the wavelength conversion member 11.

It is preferable that the light-transmissive member 14 be not disposed above the second surface 11B of the wavelength conversion member 11, that is, at the light-emitting element 12 side. In other words, the upper surface of the light-transmissive member 14 is preferably located between the first surface 11U and the second surface 11B of the wavelength conversion member 11. The light-transmissive member 14 may cover a portion of the second surface 11B of the wavelength conversion member 11. In this case, the light-reflective member is preferably located between the light-emitting element and the light-transmissive member 14. In the case in which the lateral surfaces of the light-emitting element are covered with a light-transmissive bonding member, the light-reflective member is preferably located between the light-transmissive bonding member and the light-transmissive member. That is, it is preferable that light emitted from the light-emitting element is guided into the light-guiding plate through the wavelength conversion member.

For the light-transmissive member 14, a resin that transmits, for example, 60% or more or 70% or more of light emitted from the light-emitting element is preferably used. The examples of the resin used for the light-transmissive member 14 include epoxy resins, silicone resins, and mixtures of these resins. A silicone resin is preferably used for the light-transmissive member 14 in consideration of light-transmissivity, light resistance, and the like.

For example, the light-transmissive member 14 can be disposed in the recess 10R by potting, transferring, spraying, or the like.

Light-Emitting Element 12

The light-emitting element 12 is bonded to the second surface 11B of the wavelength conversion member.

The light-emitting element 12 includes a semiconductor layered body having a first surface 12U and a second surface 12B opposite to the first surface and electrodes 12n and 12p disposed on the second surface 12B. The first surface 12U serves as the light extracting surface. A known semiconductor light-emitting element can be used for the light-emitting element. For example, the semiconductor layered body includes a light-transmissive substrate such as a sapphire substrate and a semiconductor layer layered on the light-transmissive substrate. The semiconductor layer includes a light-emitting layer and n-type and p-type semiconductor layers on both sides of the light-emitting layer. The n-type and p-type semiconductor layers are electrically connected to the electrodes 12n and 12p, respectively. The electrodes 12n and 12p are both disposed on the second surface side of the semiconductor layered body of the light-emitting element.

When a single light-guiding plate 10 is formed with a plurality of recesses 10R, at least one light-emitting element 12 is preferably disposed in each recess 10R.

The light-emitting element is configured to emit light with a wavelength that can excite the phosphor contained in the wavelength conversion member. All or some of a plurality of light-emitting elements 12 may emit light having different colors or may emit light with the same wavelength or the same color. Examples of a light-emitting element configured to emit ultraviolet or blue light include a light-emitting element containing a nitride semiconductor ($In_xAl_yGa_{1-x-y}N$, where $0 \leq X$, $0 \leq Y$, and $X+Y \leq 1$).

The semiconductor layered body 2 can include at least one light-emitting layer configured to emit light having the emission color as described above. For example, the semiconductor layered body can include a light-emitting layer configured to emit light having a single emission color between the n-type semiconductor layer and the p-type semiconductor layer. The light-emitting layer may have a structure with a single active layer, such as a double heterojunction and a single quantum well (SQW) structure, or a structure with a group of active layers, such as a multiple quantum well (MQW) structure. The semiconductor layered body can include a plurality of light-emitting layers. For example, the semiconductor layered body may include a plurality of light-emitting layers between the n-type semiconductor layer and the p-type semiconductor layer or may have a repetitive structure including the n-type semiconductor layer, the light-emitting layer, and the p-type semiconductor layer in order. The light-emitting layers may include active layers configured to emit different emission colors or may include active layers configured to emit the same emission color. The term "same emission color" include emission colors that can be regarded as the same emission color at the time of use, such as variations in dominant wavelength of about several nanometers. The combination of the emission colors can be appropriately selected. For example, in the case in which the semiconductor layered body includes two active layers, examples of the combination of emission colors include blue and blue, ultraviolet and ultraviolet, blue and green, and blue and red.

In addition to the light-emitting element configured to emit ultraviolet or blue light described above, a light-emitting element configured to emit green or red light can be used. Various emission wavelengths can be selected by changing the materials for the semiconductor layer and the mixing ratio of the materials. The composition, emission color, size, and number of the light-emitting elements to be used can be appropriately selected according to the purpose.

The light-emitting element 12 can have any appropriate length, width, and height. The light-emitting element 12 preferably has length and width dimensions of 1,000 pin or less in a plan view. With such a light-emitting element, for example, high-definition images can be obtained through local dimming of a liquid-crystal display device.

The first surface 12U of the semiconductor layered body of the light-emitting element 12 is secured to the wavelength conversion member 11 secured in the recess 10R of the light-guiding plate 10. The first surface 12U, which is the light extracting surface of the light-emitting element 12, is preferably smaller than the first surface 11U and/or the second surface 11B of the wavelength conversion member 11. It is more preferable that the whole outer periphery of the first surface 12U of the light-emitting element 12 be located inward of the outer periphery of the second surface 11B of the wavelength conversion member 11, even more preferably inward of the outer peripheries of both of the first surface 11U and the second surface 11B of the wavelength conversion member 11.

The light-emitting element 12 is preferably secured to the wavelength conversion member 11 with a light-transmissive bonding member 16. The light-transmissive bonding member 16 covers at least a portion of the upper surface of the wavelength conversion member 11. The light-transmissive bonding member 16 may cover a portion or the whole of the lateral surfaces of the light-emitting element 12 as shown in FIG. 1. For example, in a cross-sectional view, the light-transmissive bonding member 16 covering the lateral surfaces of the light-emitting element 12 can have a width on the wavelength conversion member 11 side larger than a width of the light-transmissive bonding member 16 on the electrodes side. For the light-transmissive bonding member, for example, a light-transmissive material such as thermosetting resins including epoxy resins, silicone resins, and modified silicone resins can be used. The light-transmissive material can be disposed on the light-emitting element or the wavelength conversion member by potting, printing, or the like. Placing the wavelength conversion member on the light-transmissive material and performing heating to cure the light-transmissive material allows for bonding the light-transmissive bonding member.

In the case in which the light-transmissive bonding member 16 is disposed on the lateral surfaces of the light-emitting element 12, light emitted toward lateral surfaces of the light-emitting element 12 can be efficiently extracted toward the wavelength conversion member 11 and the light-guiding plate 10.

The arrangement pitch of the light-emitting elements 12 can be equal to the pitch of the positions of the recesses 10R of the light-guiding plate 10 described above. For example, the distance between the light-emitting elements 12 can be in a range of 0.05 mm to 20 mm. With such an arrangement pitch, uniform luminance in the plane of the light-guiding plate 10 can be obtained.

Light-Reflective Member 15

The light-reflective member 15 covers the second main surface 10B of the light-guiding plate and the lateral surfaces of the light-emitting element 12. In the case in which the light-emitting element 12 has the first surface 12U smaller than the second surface 11B of the wavelength conversion member 11 as described above, the light-reflective member 15 also covers a portion of the second surface 11B of the wavelength conversion member 11. It is preferable that the light-reflective member 15 further cover an entirety of a surface of the light-transmissive member 14 on the light-emitting element 12 side. In the case in which the lateral surfaces of the light-emitting element 12 are partially covered with the light-transmissive bonding member 16, an entirety of a surface of the light-transmissive bonding member 16 at a side opposite to a side where the light-emitting element 12 is disposed is preferably covered with the light-reflective member 15. In other words, the light-reflective member 15 can form a curved surface convex toward the lateral surfaces of the light-emitting element 12 according to the shape of a lateral surface of the light-transmissive bonding member 16 at a side opposite to a side where the light-emitting element is disposed. That is, on the lateral surfaces of the light-emitting element 12, the light-reflective member 15 can have a width that is larger on the electrode side and gradually decreases toward the wavelength conversion member 11 in a cross-sectional view as shown in FIG. 1.

A portion of the light-reflective member 15 is preferably located inside the recess 10R as shown in FIGS. 1 and 2 in a plan view.

The light-reflective member 15 may be in contact with a portion or the whole of the lateral surface defining the recess 10R, as shown in FIG. 2, Surfaces of the electrodes 12n and 12p of the light-emitting element 12 are preferably exposed from the light-reflective member 15. In the manufacturing, the surfaces of the electrodes of the light-emitting element 12 may be temporarily embedded in the light-reflective member 15, and the light-reflective member 15 may be then partially removed to expose the surfaces of the electrodes 12n and 12p of the light-emitting element 12. The surface of the light-reflective member 15, a surface of the electrode 12n, and a surface of the electrode 12p are preferably in the same plane.

The light-reflective member 15 can be formed of a resin material, a light-reflective substance, and the like. For example, the light-reflective member 15 can be formed by transfer molding, potting, printing, or spraying. In the case of including a step of removing a portion of the light-reflective member 15 in the thickness direction, the step of removing can be performed by grinding, etching, or the like.

Examples of the resin material used for the light-reflective member 15 include thermosetting resins and thermoplastic, resins, and more specific examples thereof include epoxy resins, silicone resins, modified epoxy resins such as silicone-modified epoxy resins, modified silicone resins such as epoxy-modified silicone resins, unsaturated polyesters, saturated polyesters, polyimide resins, modified polyimide resins, polyphthalamide (PPA), polycarbonates, poly(phenylene sulfide) (PPS), liquid crystal polymers (LCPs), ABS resins, phenolic resins, acrylic resins, and PBT resins. In particular, a thermosetting resin such as epoxy resins, silicone resins, and modified silicone resins is preferably used. Examples of the light-reflective substance include titanium oxide, silicon oxide, zirconium oxide, potassium titanate, aluminum oxide, zinc oxide, aluminum nitride, boron nitride, and mullite. For example, the content of the light-reflective substance can be in a range of 20 wt % to 70 wt % of the total weight of the resin.

With the light-reflective member 15 covering the second main surface 10B of the light-guiding plate 10 and the lateral surfaces of the light-emitting element 12, light emitted from the light-emitting element can be efficiently incident on the wavelength conversion member 11 through the first surface 12U of the semiconductor layered body. In the case in which the light-transmissive bonding member 16 covers the lateral surfaces of the light-emitting element, light emitted from the lateral surfaces of the light-emitting element can be efficiently incident on the wavelength conversion member 11 through the light-transmissive bonding member 16.

The wavelength conversion member 11 and the light-emitting element 12 are disposed in each of the recesses 10R, of the light-guiding plate 10 in the light-emitting module in the present embodiment, so that the wavelength conversion member 11 and the light-emitting element 12 can be easily and precisely aligned. Accordingly, light emitted from the light-emitting elements 12 can be uniform, so that the light-emitting module with a reduced color shift can be obtained.

The light-emitting module can include a wiring layer 17 on the electrodes 12n and 12p and the light-reflective member 15, the wiring layer 17 being connected to the electrodes 12n and 12p, as shown in FIGS. 1 and 2. Further, the light-emitting module can include an insulating member 18 covering a surface of the wiring layer 17.

In the case in which the light-guiding plate 10 provided is larger than the target size of the light-emitting module in the manufacturing, a step of cutting the light-guiding plate 10 and the light-reflective member can be included.

Examples of the wiring layer 17 include a single-layer film and a layered film of a metal such as Au, Pt, Pd, Rh, Ni, W, Mo, Cr, and Ti or an alloy of one or more of these metals.

The specific examples include a metal film of Cu/Ni/Au layered in order from the light-guiding plate 10 side.

Examples of the insulating member 18 include a wiring board. For example, a base material of the wiring board can be formed of a ceramic such as aluminum nitride or a resin. Examples of the resin include phenolic resins, epoxy resins, polyimide resins, BT resins, polyphthalamide (PPA), polyethylene terephthalate) (PET), unsaturated polyesters, and composite materials such as glass epoxy. The wiring board may be a rigid substrate or a flexible substrate.

Figure 3:
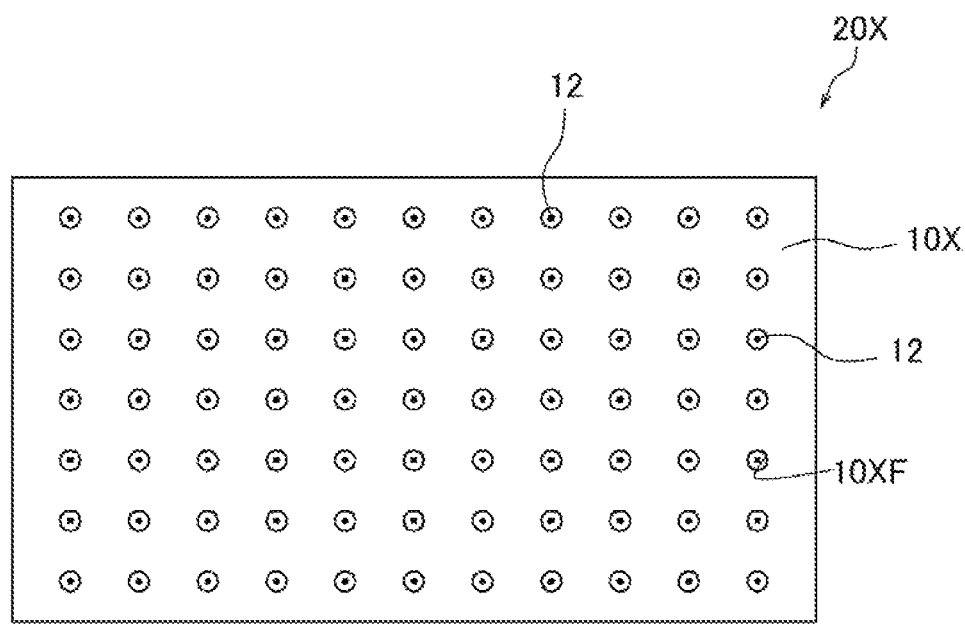
FIG. 3 is a schematic plan view of a light-emitting module of an embodiment of the present invention.

In the case in which a single light-guiding plate 10X includes a plurality of light-emitting elements 12, electrical connections may be established such that the light-emitting elements 12 are separately turned on in a light-emitting module 20X of another embodiment as shown in FIG. 3. FIG. 3 schematically shows the light-emitting module including the light-guiding plate 10X defining the conical depressions 10XF shown in FIG. 5A as the light-guiding plate.

In the light-emitting module 20X, electrical connection may be established such that a plurality of light-emitting elements 12 are turned on at the same time to constitute a single light-emitting region. For example, by dividing the light-emitting elements 12 arranged in a matrix into four light source groups arranged in a two-by-two matrix and establishing electrical connections such that light is emitted in units of groups, the light-emitting module that allows for local dimming can be obtained.

Figure 4:
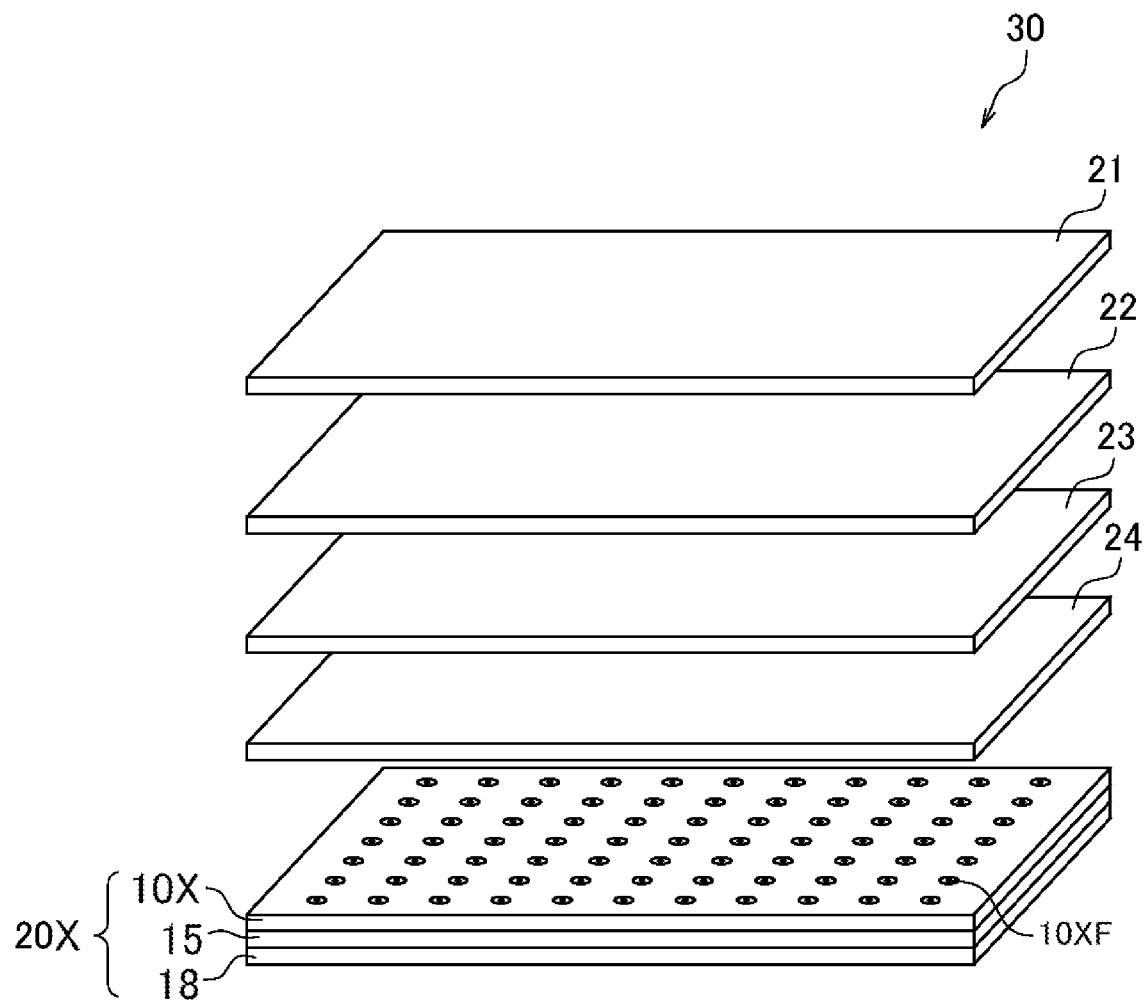
FIG. 4 is a schematic exploded perspective view of a liquid-crystal display device employing the light-emitting module according to one embodiment of the present invention.

For example, the light-emitting module 20X can be used for a liquid-crystal display device 30 as shown in FIG. 4. The liquid-crystal display device 30 includes a liquid-crystal panel 21, lens sheets 22 and 23, a diffusion sheet 24, and the light-emitting module 20X in the order from an upper side. The liquid-crystal display device 30 is what is called a direct-lit liquid-crystal display device in which the light-emitting module 20X is disposed below the liquid-crystal panel 21. In the liquid-crystal display device 30, the liquid-crystal panel 21 is irradiated with light emitted from the light-emitting module 20X. The liquid-crystal display device 30 may further include members such as a polarizing film and a color filter.

While certain embodiments of the present invention have been described above, the present invention is not limited the description above, and should be broadly construed on the basis of the claims. The present invention also encompasses variations and modifications that are made on the basis of the description above.

What is claimed is:

1. A light-emitting module comprising:
    a light-guiding plate having a first main surface serving as a light extracting surface and a second main surface located opposite to the first main surface, a recess being defined in the second main surface by at least one lateral surface and a base surface;
    a wavelength conversion member disposed in the recess of the light-guiding plate, the wavelength conversion member having a first surface facing the base surface defining the recess, a second surface opposite to the first surface, and at least one lateral surface between the first surface and the second surface, the wavelength conversion member having a thickness smaller than a depth of the recess;
    at least one light-emitting element bonded to the second surface of the wavelength conversion member;
    a light-transmissive member disposed between the at least one lateral surface defining the recess and the at least one lateral surface of the wavelength conversion member; and
    a light-reflective member covering the second main surface of the light-guiding plate and lateral surfaces of the at least one light-emitting element, the light-reflective member being located inside the recess and being in contact with the at least one lateral surface defining the recess.

2. The light-emitting module according to claim 1, wherein
    the light-reflective member covers a portion of the second surface of the wavelength conversion member.

3. The light-emitting module according to claim 1, wherein
    the lateral surfaces of the at least one light-emitting element are located inward of the at least one lateral surface of the wavelength conversion member.

4. The light-emitting module according to claim 1, further comprising
    a light-transmissive bonding member bonding the wavelength conversion member and the at least one light-emitting element, wherein
    the light-transmissive bonding member covers a portion of the lateral surfaces of the at least one light-emitting element.

5. The light-emitting module according to claim 1, wherein
    the light-guiding plate defines a depression in the first main surface.

6. The light-emitting module according to claim 5, wherein
    in the light-guiding plate, the depression in the first main surface overlaps the recess in the second main surface in a plan view.

7. The light-emitting module according to claim 1, further comprising
    a plurality of additional light-emitting elements, wherein
    the light-guiding plate further includes a plurality of additional recesses in the second main surface, and
    the additional light-emitting elements respectively overlap the additional recesses in a plan view.

8. The light-emitting module according to claim 2, wherein
    the lateral surfaces of the at least one light-emitting element are located inward of the at least one lateral surface of the wavelength conversion member.

9. The light-emitting module according to claim 8, further comprising
    a light-transmissive bonding member bonding the wavelength conversion member and the at least one light-emitting element, wherein
    the light-transmissive bonding member covers a portion of the lateral surfaces of the at least one light-emitting element.

* * * * *